United States Patent
Tachizono et al.

(10) Patent No.: US 8,895,460 B2
(45) Date of Patent: *Nov. 25, 2014

(54) GLASS COMPOSITION, ELECTRICALLY CONDUCTIVE PASTE COMPOSITION COMPRISING SAME, ELECTRODE WIRING MEMBER, AND ELECTRONIC COMPONENT

(75) Inventors: Shinichi Tachizono, Narita (JP); Kei Yoshimura, Inba (JP); Yuji Hashiba, Narita (JP); Takashi Naito, Funabashi (JP); Takuya Aoyagi, Hitachi (JP)

(73) Assignee: Hitachi Powdered Metals Co., Ltd., Chiba (JP)

(*) Notice: Subject to any disclaimer, the term of this patent is extended or adjusted under 35 U.S.C. 154(b) by 383 days.

This patent is subject to a terminal disclaimer.

(21) Appl. No.: 13/259,327

(22) PCT Filed: Mar. 26, 2010

(86) PCT No.: PCT/JP2010/002188
§ 371 (c)(1),
(2), (4) Date: Nov. 29, 2011

(87) PCT Pub. No.: WO2010/109905
PCT Pub. Date: Sep. 30, 2010

(65) Prior Publication Data
US 2012/0067415 A1 Mar. 22, 2012

(30) Foreign Application Priority Data
Mar. 27, 2009 (JP) .................. 2009-078961

(51) Int. Cl.
*C03C 3/21* (2006.01)
*C03C 8/18* (2006.01)
*H01L 31/0224* (2006.01)
*C03C 8/08* (2006.01)

(52) U.S. Cl.
CPC ......... *H01L 31/022425* (2013.01); *Y02E 10/50* (2013.01); *C03C 3/21* (2013.01); *C03C 8/18* (2013.01); *H01J 2211/366* (2013.01); *C03C 8/08* (2013.01)
USPC ............. 501/46; 136/256; 252/512; 252/514; 361/697

(58) Field of Classification Search
USPC .................. 252/512, 514; 136/256; 361/679; 501/46
See application file for complete search history.

(56) References Cited

U.S. PATENT DOCUMENTS
2009/0199897 A1   8/2009   Naito

FOREIGN PATENT DOCUMENTS

| JP | 03-127630 | 5/1991 |
|---|---|---|
| JP | 07-069672 | 3/1995 |
| JP | 2004-250276 | 9/2004 |
| JP | 2007-059380 | 3/2007 |
| JP | 2008-543080 | 11/2008 |
| JP | 2009-209032 | 9/2009 |
| JP | 2009-221049 | 10/2009 |
| WO | WO 2006/132766 A2 | 12/2006 |

*Primary Examiner* — Khanh Tuan Nguyen
(74) *Attorney, Agent, or Firm* — Antonelli, Terry, Stout & Kraus, LLP.

(57) ABSTRACT

A glass composition according to the present invention comprises: phosphorus, vanadium and at least one transition metal selected from a group consisting of tungsten, iron, and manganese, the glass composition not containing substances included in the JIG level A and B lists, a softening point of the glass composition being 550° C. or lower.

21 Claims, 4 Drawing Sheets

GLASS COMPOSITION, ELECTRICALLY CONDUCTIVE PASTE COMPOSITION COMPRISING SAME, ELECTRODE WIRING MEMBER, AND ELECTRONIC COMPONENT

TECHNICAL FIELD OF THE INVENTION

The present invention relates to glass compositions, and particularly to glass compositions which soften and melt at about 500 to 600° C. and are environmentally safe. The invention also relates to electrically conductive paste compositions including the glass composition, electrode/wiring members including the glass composition, and electronic components including the glass composition of the invention.

DESCRIPTION OF BACKGROUND ART

In electronic components (devices) such as solar cell panels, plasma display panels (PDPs) and liquid crystal display (LCD) panels, an electrode/wiring member (interconnection member) is formed on the approximately entire surface of the panel. Such an interconnection member is formed by applying, on a substrate (such as silicon and glass substrates), an electrically conductive paste containing a metal powder, a glass powder, a resin binder and a solvent, and firing the applied paste. The conductive paste is heated above the softening point of the glass powder contained in the paste, and as a result the glass powder softens and flows. By this firing process, the interconnection member becomes formed of a dense material and also strongly adheres to the substrate.

For example, in solar cell panels, a light receiving plane interconnection member is formed on the light receiving plane of the solar cell, and a current collecting interconnection member and an output interconnection member are formed on the back side plane of the cell. Typically, silver is used for the light receiving plane interconnection member and the output interconnection member, and aluminum is used for the current collecting interconnection member. A problem is that conventionally, these interconnection members also contain a lead-containing glass composition.

In these years, with the worldwide strong trend towards environmentalism, the use of environmentally hazardous materials such as lead and mercury is increasingly restricted. Europe enforces "DIRECTIVE 2002/95/EC OF THE EUROPEAN PARLIAMENT AND OF THE COUNCIL of 27 Jan. 2003 on the restriction of the use of certain hazardous substances in electrical and electronic equipment" (the RoHS directive adopted by the European Union). To comply with the RoHS directive, various lead-free glass compositions for interconnection member use are being proposed. For example, Patent Literature 1 (JP-A 2008-543080, WO2006/132766) and Patent Literature 2 (JP-A 2007-59380) disclose a glass composition containing bismuth oxide as a major constituent. Patent Literature 3 (JP-A Hei 7 (1995)-69672) discloses a glass composition containing tin oxide as a major constituent. Patent Literature 4 (JP-A 2004-250276) discloses a glass composition containing vanadium oxide as a major constituent.

Patent Literature 1: Japanese Patent Laid-open No. 2008-543080
Patent Literature 2: Japanese Patent Laid-open No. 2007-59380
Patent Literature 3: Japanese Patent Laid-open No. Hei 7 (1995)-69672
Patent Literature 4: Japanese Patent Laid-open No. 2004-250276

DISCLOSURE OF THE INVENTION

Problems to be Solved by the Invention

As described above, with the worldwide strong trend towards green (environmentally friendly) procurements and designs in the electrical and electronic device industry, there is a great need for environmentally safer materials. An electronic industry group in Japan has issued, jointly with industry groups in the U.S. and Europe, the Joint Industry Guide for Material Composition Declaration for Electronic Products (JIG). Bismuth contained in lead-free bismuth-based glasses and antimony contained in lead-free antimony-based glasses, the use of which are current not restricted under the RoHS directive, are included in the JIG level B list of survey target chemical substances.

Examples of the JIG level A substances include: asbestos, certain azocolourants and azodyes, cadmium/cadmium compounds, hexavalent chromium/hexavalent chromium compounds, lead/lead compounds, mercury/mercury compounds, ozone depleting substances (such as CFCs, HCFCs, HBFCs and carbon tetrachloride), polybrominated biphenyls (PBBs), polybrominated diphenyl ethers (PBDEs), polychlorinated biphenyls (PCBs), polychlorinated naphthalenes (three or more chlorine atoms), radioactive substances, certain shortchain chlorinated paraffins, tributyl tin (TBT), triphenyl tin (TPT), and tributyl tin oxide (TBTO).

Furthermore, examples of the JIG level B substances include: bismuth/bismuth compounds, antimony/antimony compounds, arsenic/arsenic compounds, beryllium/beryllium compounds, brominated flame retardants (other than PBBs and PBDEs), nickel, certain ester phthalates, selenium/selenium compounds, and polyvinyl chloride (PVC).

The glass compositions disclosed in the above Patent Literature 1 (JP-A 2008-543080, WO2006/132766) and Patent Literature 2 (JP-A 2007-59380) have, as a major constituent, bismuth oxide included in the JIG level B list. The glass composition disclosed in the above Patent Literature 3 (JP-A Hei 7 (1995)-69672) contains tin as a major constituent and does not contain JIG level A or B substances. However, such a glass composition has a problem in that adsorbed moisture may corrode stannous oxide (SnO) which is a major constituent of the glass composition, thereby degrading adhesiveness to a substrate and failing to provide a reliable interconnection member. A generally accepted reason for this is that stannous oxide (SnO), the backbone constituent of such a tin-containing glass composition, is oxidized to stannic oxide ($SnO_2$). The glass composition disclosed in the above Patent Literature 4 (JP-A 2004-250276) contains vanadium oxide and tellurium oxide as major constituents, and therefore has a cost problem because tellurium is a rare metal.

In view of the above background of the invention, further effort is needed to develop glass compositions for use in electronic/electrical devices (such as solar cell panels and display devices) which have a performance comparable or superior to that of conventional low softening point glass compositions and do not harm the environment. Accordingly, it is an objective of the present invention to provide a glass composition which can be fired at a relatively low temperature such as about 500 to 600° C. in an air atmosphere and does not contain the JIG substances such as lead, bismuth and antimony. It is another objective of the invention to provide interconnection members and electronic devices made from the glass composition of the present invention that can be particularly advantageously applied to electronic devices such as solar cell panels and display devices.

(1) According to an aspect of the present invention, there is provided a glass composition including: phosphorus; vanadium; and at least one transition metal selected from a group consisting of tungsten, iron, and manganese, the glass composition not containing substances included in the JIG level A and B lists, a softening point of the glass composition being 550° C. or lower.

JIG survey target substances as used herein are the ones specified in the Japanese translation version of the JIG-101A (the revision of JIG-101) issued in 2007. See Nonpatent Document 1 below. In addition, the term "does not contain the JIG level A or B substances" means "does not contain the JIG level A or B substances above the JIG threshold levels for reporting" specified in the Japanese translation version of the JIG-101A. In other words, the glass composition according to the present invention may contain the JIG level A and B substances less than the JIG threshold levels for reporting.

Nonpatent Document 1: MATERIAL COMPOSITION DECLARATION GUIDE FOR ELECTROTECHNICAL PRODUCTS, (Japanese translation version of the JIG-101A (the revision of JIG-101)

(2) According to another aspect of the present invention, there is provided a glass composition including phosphorus and transition metals, the transition metals including: vanadium; and iron and/or manganese, the glass composition not containing substances included in the JIG level A and B lists, in which: the phosphorus (P), the vanadium (V), the iron (Fe) and the manganese (Mn) are on the oxide basis in the form of $P_2O_5$, $V_2O_5$, $Fe_2O_3$ and $MnO_2$, respectively; numerical values of mass percentages of the $P_2O_5$, the $V_2O_5$, the $Fe_2O_3$ and the $MnO_2$ satisfy the equation (1) below; and a total mass percentage of the $Fe_2O_3$ and the $MnO_2$ is within a range from 5 to 15 mass %.

$$3 \times \frac{[V_2O_5]}{[P_2O_5]} < [Fe_2O_3] + [MnO_2] \quad \text{Equation (1)}$$

where $[P_2O_5]$, $[V_2O_5]$, $[Fe_2O_3]$ and $[MnO_2]$ represent numerical values of the mass percentages (on the oxide basis) of $P_2O_5$, $V_2O_5$, $Fe_2O_3$ and $MnO_2$, respectively.

(3) According to still another aspect of the present invention, there is provided a glass composition including, on average and on the oxide basis: 25 to 60 mass % of $V_2O_5$ (vanadium pentoxide); 12 to 30 mass % of $P_2O_5$ (phosphorus pentoxide); 0 to 15 mass % of $Fe_2O_3$ (ferric oxide); 0 to 15 mass % of $MnO_2$ (manganese dioxide); 0 to 40 mass % of $WO_3$ (tungsten trioxide); 0 to 30 mass % of $BaO$ (barium oxide); and 0 to 20 mass % of $ZnO$ (zinc oxide), the glass composition not containing substances included in the JIG level A and B lists, in which: a total content of the $Fe_2O_3$ and the $MnO_2$ is within a range from 5 to 15 mass %; and a total content of the $BaO$ and the $ZnO$ is within a range from 0 to 30 mass %.

In the above aspects (1) to (3) of the invention, the following modifications and changes can be made.

(i) There is provided an electrically conductive paste composition including: the above-described glass composition; and a vehicle. Meanwhile, in the present invention, "a paste composition" is defined as a form of a liquid mixture.

(ii) There is provided an electrode/wiring member including: the above-described glass composition; and a metal powder. Meanwhile, in the present invention, "an electrode/wiring member" is defined as a solidified form prepared by applying and firing the above-described paste composition.

(iii) The metal powder is silver, copper, aluminum, or an alloy containing one of these metals as a major constituent.

(iv) There is provided an electronic component including an electrode/wiring member, the electrode/wiring member including: a metal powder; and a glass phase made from the above-described glass composition.

(v) The electronic component is a display device, a solar cell panel, or a ceramic mounting board.

Advantages of the Invention

According to the present invention, there can be provided a glass composition which softens and melts at a relatively low temperature such as about 500 to 600° C., and can be advantageously used in electrode/wiring members for electronic components such as solar cell panels and display devices. Even when an electrode/wiring member containing the invented glass composition is fired in an air atmosphere, metal particles contained in the electrode/wiring member are not oxidized. In addition, the glass composition of the invention; and electrically conductive paste compositions, electrode/wiring members and electronic components including the invented glass composition comply with the RoHS directive, and also do not contain JIG level A and B substances, and therefore have the advantage of high environmental responsibility. Furthermore, the glass composition of the invention can also be applied to other purposes than electrode/wiring members or electronic components, and products utilizing the glass composition of the invention comply with environment and safety regulations.

BRIEF DESCRIPTION OF THE DRAWINGS

FIG. 2 is schematic illustrations showing an exemplary solar cell panel, in which

LEGEND

Figure 1:
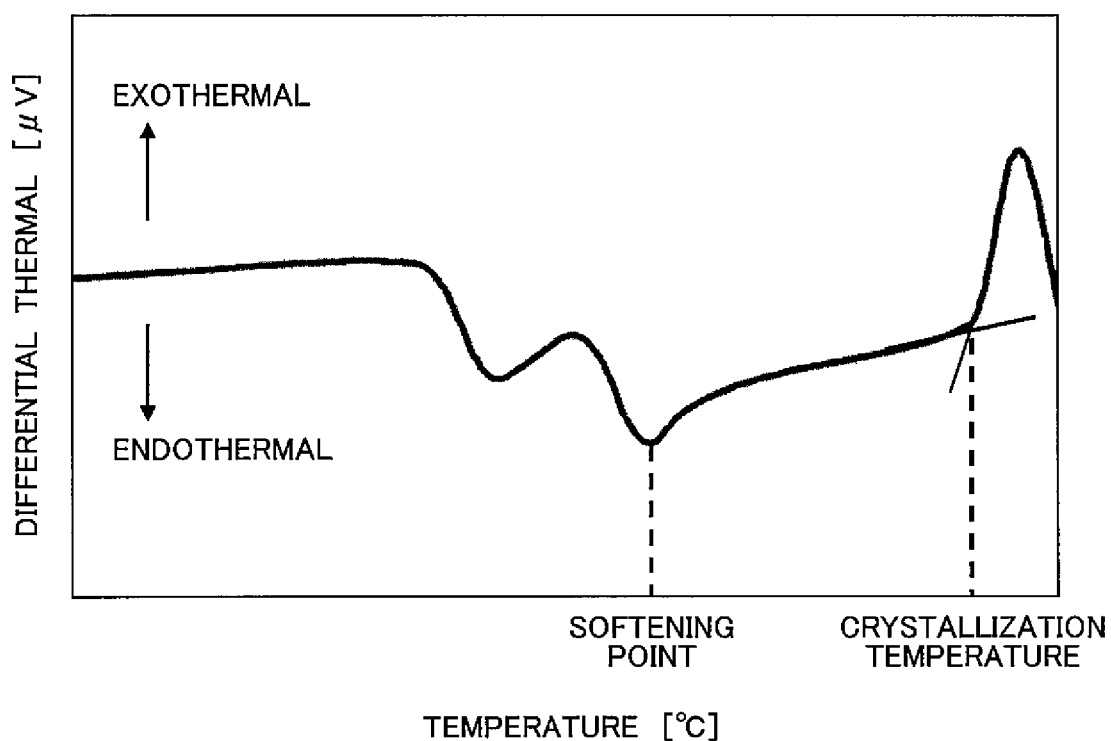
FIG. 1 shows an exemplary DTA curve obtained in a DTA measurement of a glass composition.

100 . . . solar cell panel;
10 . . . semiconductor substrate;
11 . . . n-type diffusion layer;
12 . . . antireflection layer;
13 . . . light receiving plane electrode/wiring member;
14 . . . current collecting electrode/wiring member;
15 . . . output electrode/wiring member;
16 . . . electrode constituent diffusion layer;
200 . . . plasma display panel;
20 . . . front plate;
21 . . . back plate;
22 . . . barrier rib;
23 . . . sealant;
24 . . . cell;

25 ... red phosphor;
26 ... green phosphor;
27 ... blue phosphor;
28 ... display electrode line;
29 ... address electrode line;
30 ... ultraviolet light;
31 ... black matrix;
32, 33 ... dielectric layer;
34 ... protective layer;
300 ... multilayer wiring board;
40 ... conductive paste;
41 ... green sheet; and
42 ... through-hole.

MODE FOR CARRYING OUT THE INVENTION

First, outline for elements constituting a glass will be described. It is known that a glass can be formed in the form of oxides of 16 elements which are about 1/6 of all elements. Specifically, they are Al (aluminum), B (boron), Ba (barium), Sr (strontium), Ca (calcium), F (fluorine), Fe (iron), K (potassium), Mg (magnesium), Na (soda), Li (lithium), O (oxygen), P (phosphorus), Pb (lead), Si (silicon), and Zn (zinc).

According to K. H. Sun, these oxides can be classified into three classes (K. H. Sun: J. Am. Ceram. Soc., 30 (1947) 277). One is a network formation oxide which can form a network structure alone (e.g., $SiO_2$, $B_2O_3$, $P_2O_5$, $GeO_2$, $V_2O_5$, $Al_2O_3$, etc.). Another is a modifier oxide that enters a network structure formed by the network formation oxides and affects the characteristics of the glass (e.g., MgO, $Pb_2O$, $Li_2O$, BaO, etc.). The other is an intermediate oxide that does not form a network structure alone but is substituted for a part of the network structure formed by the network formation oxides (e.g., $TiO_2$, ZnO, PbO, etc.).

In general, when a glass having a softening point of 550° C. or lower will be formed, one of $B_2O_3$, $P_2O_5$ and $V_2O_5$ is used as a network formation oxide. Conventionally, in the case that $B_2O_3$ is selected as a network formation oxide, PbO and/or $Bi_2O_3$ are added to the glass; in the case that $P_2O_5$ is selected as a network formation oxide, SnO and/or $V_2O_5$ are added to the glass; and in the case that $V_2O_5$ is selected as a network formation oxide, $TeO_2$ is added to the glass.

In the present invention, from a viewpoint of environment and safety regulations and from another viewpoint of a reserves/production ratio, $V_2O_5$ and $P_2O_5$ were selected as network formation oxides of main starting materials. Meanwhile, Naitoh et al. report an effect of $V_2O_5/P_2O_5$ ratio in $V_2O_5$—$P_2O_5$ system glass (Naitoh et al.: J. Ceram. Soc. Jpn. Inter. Ed. Vol 97 (1989) 822). According to Naitoh et al., a softening point of the glass decreases with increasing $V_2O_5/P_2O_5$ ratio in the glass. As $V_2O_5/P_2O_5$ ratio increases, however, the glass is prone to be crystallized and a water-resistant property of the glass is degraded.

Preferred embodiments of the present invention will be described below. The invention is not limited to the specific embodiments described herein, but various combinations of their features are possible.

(Average Composition of Glass)

The constituent of the glass composition according to the present invention will be described. As described before, the glass composition of the invention contains: phosphorus; vanadium; and at least one transition metal selected from a group consisting of tungsten, iron, and manganese. In addition, the glass composition of the invention does not contain JIG level A and B substances.

Meanwhile, the glass composition according to the present invention contains phosphorus and transition metals, the transition metals including: vanadium; and iron and/or manganese. The numerical value of the total mass percentage on the oxide basis of the $Fe_2O_3$ and the $MnO_2$ ($[Fe_2O_3]+[MnO_2]$) is larger than three times the mass percentage ratio (on the oxide basis) of the $V_2O_5$ to the $P_2O_5$ ($[V_2O_5])/[P_2O_5]$). The total content of the $Fe_2O_3$ and the $MnO_2$ is within a range from 5 to 15 mass %. In addition, the glass composition of the invention does not contain JIG level A and B substances.

Specifically, the glass composition according to the invention on average contains, on the oxide basis: 25 to 60 mass % of $V_2O_5$; 12 to 30 mass % of $P_2O_5$; 0 to 15 mass % of $Fe_2O_3$; 0 to 15 mass % of $MnO_2$; 0 to 40 mass % of $WO_3$; 0 to 30 mass % of BaO; and 0 to 20 mass % of ZnO, with the total content of the $Fe_2O_3$ and the $MnO_2$ ranging from 5 to 15 mass % and the total content of the BaO and the ZnO ranging from 0 to 30 mass %. In addition, the glass composition of the invention does not contain JIG level A and B substances.

As described before, $V_2O_5$ (vanadium pentoxide) and $P_2O_5$ (phosphorus pentoxide) are backbone constituents of the invented glass composition. The $V_2O_5$ content is preferably from 25 to 60 mass %. At a content less than 25 mass %, an effect of decreasing a softening point of the glass composition is inadequate. At a content more than 60 mass %, the glass composition is prone to crystallize, resulting in low electrical resistivity, and also has poor moisture resistance.

The $P_2O_5$ content is preferably from 12 to 30 mass %. A content less than 12 mass % causes the glass composition to easily crystallize. On the other hand, a content more than 30 mass % causes the glass composition to have a high softening point.

When three times the numerical value of $[V_2O_5]/[P_2O_5]$ exceeds "15" (i.e., the numerical value of $[V_2O_5]/[P_2O_5]$ exceeds "5"), the glass composition is prone to crystallize during the formation (firing) of an electrode/wiring member. On the contrary, when three times the numerical value of $[V_2O_5]/[P_2O_5]$ is less than "1.5" (i.e., the numerical value of $[V_2O_5]/[P_2O_5]$ is less than "0.5"), the glass composition undesirably has a high softening point. As a result, the glass composition does not melt during the formation (firing) of an electrode/wiring member, thus degrading the adhesiveness to a substrate.

$Fe_2O_3$ (ferric oxide) and $MnO_2$ (manganese dioxide) are constituents to improve the moisture resistance of the V—P based glasses. The total content of the $Fe_2O_3$ and the $MnO_2$ is preferably within a range from 5 to 15 mass %, and more preferably from 5 to 10 mass %. A total content less than 5 mass % will not provide sufficient moisture resistance. On the other hand, a total content more than 15 mass % will undesirably cause the glass composition to easily crystallize during the firing of the glass composition. The individual content of each of the $Fe_2O_3$ and the $MnO_2$ is preferably within a range from 0 to 15 mass %.

$WO_3$ (tungsten trioxide) is a modifier constituent (modifier oxide) of the V—P based glasses. Its content is preferably within a range from 0 to 40 mass %, and more preferably from 0 to 25 mass %. A content more than 40 mass % will undesirably cause the glass composition to have a high softening point. As a result, the glass composition does not melt during the formation (firing) of electrode/wiring member, thus degrading the adhesiveness to a substrate.

BaO (barium oxide) and ZnO (zinc oxide) are also modifier constituents (modifier oxides) to improve the moisture resistance of the glass composition. The BaO content is preferably within a range from 0 to 30 mass %. BaO content more than 30 mass % will undesirably cause the glass composition to have a high softening point. The ZnO content is preferably within a range from 0 to 20 mass %. ZnO content more than 20 mass % will undesirably cause the glass composition to easily crystallize. The total content of the BaO and the ZnO is preferably within a range from 0 to 30 mass %. A total content more than 30 mass % will undesirably cause the glass composition to have a high softening point or to easily crystallize.

As explained above, the glass composition of the present invention complies with the RoHS directive and does not contain the JIG level A and B substances, and therefore the invented glass composition is environmentally more friendly than conventional glass compositions. As needed, other constituents (such as transition metals other than the above-described ones, alkali metals, and alkaline-earth metals) which are not included in the JIG level A and B lists may be added to the glass composition of the invention.

(Softening Point of Glass Composition)

The glass composition according to the present invention is prepared so as to have a softening point of 550° C. or lower. The reason for this is as follows: In forming an electrode/wiring member for display devices such as PDPs, the glass composition used to form the electrode/wiring member needs to be fired typically by heating to 550 to 600° C. at a rate of 5° C./min and maintaining this temperature for 30 min to 2 hrs. In the case of solar cell panels, the glass composition used to form the electrode/wiring member is fired typically by heating to about 800° C. and maintained this temperature for a short period of time (e.g., several seconds to several tens of seconds). In both cases, when the softening point of the glass composition used is higher than 550° C., the glass composition may not soften sufficiently within the above-mentioned firing period of time, thus possibly resulting in poor adhesiveness. Therefore, the glass composition of the invention needs to be prepared so as to have a softening point of 550° C. or lower.

(Electrode/Wiring Member)

When the glass composition according to the present invention is used for an electrode/wiring member, the glass composition is mixed with a metal powder (which is a major conductive constituent). The metal type is not particularly limited, but silver (Ag), copper (Cu), aluminum (Al), or an alloy containing one of these metals as a major constituent is preferable. Also, it is preferable that a filler powder is dispersed in the glass composition. Preferably, the content of the glass composition is from 0.5 to 15 vol. %; the content of the metal powder is from 65 to 99.5 vol. %; and the content of the filler powder is 20 vol. % or less. The composition of the electrode/wiring member is not limited to the above composition, but may be properly changed in consideration of the electrical conductivity requirement or the specific application.

(Electrically Conductive Paste Composition)

When the electrode/wiring member according to the present invention is applied to an electronic component (e.g., a solar cell panel), it is preferable to use a liquid paste (an electrically conductive paste composition) prepared by adding a solvent, a resin, a vehicle and an additive to a mixture of the invented glass composition and a metal powder (major conductive constituent). The metal powder can consist of, e.g., aluminum contained particles, copper contained particles, phosphorus contained copper alloy particles, silver coated copper particles, surface-treated copper particles, aluminum particles, copper particles, or silver particles. Meanwhile, when the silver particles are used as a metal powder, it is preferable to control an amount of the metal powder for preventing from decreasing the electrical conductivity due to a formation of silver vanadate.

There is no particular limitation on a method for preparing an electrically conductive paste composition according to the invention. The electrically conductive paste composition can be prepared by mixing and dispersing the glass composition powder, the metal particles, a solvent, a resin, and an additive (other component described later) to be added as needed.

(Aluminum Particles and Aluminum Contained Particles as Metal Particles)

As an example of the metal particles included in an electrically conductive paste composition and an electrode/wiring member according to the present invention, aluminum system particles will be described below. There is no particular limitation on aluminum particles and aluminum contained particles. For example, pure aluminum particles or aluminum alloy particles can be used. The content of aluminum contained particle may include at least one element from a group consisting of lead (Pb), silicon (Si), iron (Fe), copper (Cu), manganese (Mn), magnesium (Mg), chromium (Cr), zinc (Zn), titanium (Ti), vanadium (V), gallium (Ga), nickel (Ni), and boron (B) within an allowable amount from a viewpoint of environment and safety regulations, and may include a limited amount of inevitable impurity elements.

The above-mentioned aluminum particles and aluminum-contained particles can be fabricated by a conventional method. For example, first, molten metal of aluminum or aluminum alloy is prepared and casted, thereby obtaining an ingot. Next, the ingot is properly homogenized. After that, by conducting a hot rolling and a cold rolling, an aluminum plate can be obtained. During the cold rolling process, an intermediate process annealing may be carried out at a temperature of 150 to 400° C. Finally, the aluminum system particles are fabricated by a mechanical powdering method (e.g., stamp mill method, ball mill method, or the like). Alternatively, the aluminum system particles can be prepared by a direct powdering method from a molten metal (e.g., atomization method).

(Size and Shape of Metal Particles)

There is no particular limitation on diameters of the metal particles. However, it is preferable a particle diameter of 0.4 to 10 μm, more preferably 1 to 7 μm, as 50% diameter (often called as "D50" or "median diameter") in cumulative distribution of particle size distribution. The metal particles with a diameter of 0.4 μm or more exhibit a higher oxidation resistance. And, the metal particles with a diameter of 10 μm or less decrease the electric resistance of electrode/wiring member effectively, because contact area between the metal particles increase. Diameters of the metal particles can be measured by means of, e.g., Microtrac Particle Analyzer (MT3300 available from Nikkiso Co., Ltd.). Furthermore, there is no particular limitation on shapes of the metal particles. For example, may be used the metal particles having a shape of substantially spherical, flat, blocky, platy, or scale-like. From a viewpoint of oxidation resistance and low electrical resistivity, are preferable the metal particles having a shape of substantially spherical, flat or platy.

(Solvent and Resin for Electrically Conductive Paste Composition)

An electrically conductive paste composition according to the present invention includes at least one resin and at least one solvent. Thus, fluid properties (e.g., viscosity, surface tension, etc.) of the electrically conductive paste composition of the invention can be adjusted depending on a paste application method to a silicon substrate.

For example, solvents can be used as follows:

Hydrocarbon solvents such as hexane, cyclohexane, and toluene;

Chlorinated hydrocarbon solvents such as dichloro ethylene, dichloro ethane, and dichloro benzene;

Cyclic ether solvents such as tetrahydrofuran, furan, tetrahydropyran, pyran, dioxane, 1,3-dioxolane, and trioxane;

Amide-based solvents such as N,N-dimethyl formamide, and N,N-dimethyl acetamide;

Sulfoxide solvents such as dimethyl sulfoxide, and diethyl sulfoxide;

Ketone solvents such as acetone, methyl ethyl ketone, diethyl ketone, and cyclohexanone;

Alcohol solvents such as ethanol, 2-propanol, 1-butanol, and diacetone alcohol;

Polyhydric alcohol ester solvents such as 2,2,4-trimethyl-1,3-pentanediol monoacetate, 2,2,4-trimethyl-1,3-pentanediol monopropionate, 2,2,4-trimethyl-1,3-pentanediol monobutyrate, 2,2,4-trimethyl-1,3-pentanediol monoisobutyrate, 2,2,4-triethyl-1,3-pentanediol monoacetate, ethylene glycol monomethyl ether acetate, and diethylene glycol monobutyl ether acetate;

Polyhydric alcohol ether solvents such as ethyleneglycol monobutyl ether, and diethylene glycol diethyl ether;

Terpene solvents such as α-terpinene, α-terpineol, myrcene, allo-ocimene, limonene, α-pentene, β-pinene, terpineol, carboxylic, ocimene, and phellandrene; and mixtures of the above-described solvents.

Meanwhile, from a viewpoint of printing or coating, on a substrate (e.g., silicon substrate), an electrically conductive paste composition according to the invention, it is preferable to select at least one solvent from a group consisting of polyhydric alcohol ester solvents, terpene solvents, and polyhydric alcohol ether solvents; more preferably at least one solvent selected from a group consisting of polyhydric alcohol ester solvents and terpene solvents. Solvent alone or solvents combination of two or more may be used.

It, is possible to use a resin commonly us in the art if the resin can be thermally decomposed by calcinations. Specifically as follows: cellulose resins (e.g., methyl cellulose, ethyl cellulose, carboxymethyl cellulose, nitrocellulose, etc.); polyvinyl alcohol resins; polyvinyl pyrrolidone resins; acrylic resins; vinyl acetate-acrylic acid ester copolymer resins; butyral resins such as polyvinyl butyral; alkyd resins (e.g., phenol modified alkyd resin, castor oil fatty acid modified alkyd resin, etc.); epoxy resins; phenol resins; and resin ester resins, From a viewpoint of resin lost during firing to form an electrode/wiring member, it is preferable to select cellulose resins and/or acrylic resins, more preferably cellulose resins. Resin alone or resins in combination of two or more may be used.

In the electrically conductive paste composition of the invention, content of the solvent and the resin is appropriately selected so that fluid physical properties desired can be obtained, depending on the type of solvents and resins used. For example, the total content of the solvent and resin in the electrically conductive paste composition is preferably 3 mass % or more and 30 mass % or less, more preferably 5 mass % or more and 25 mass % or less, most preferably 7 mass % or more and 20 mass % or less. By adjusting the total content of the solvent and resin within the above range in the electrically conductive paste composition, application of the paste onto a substrate can be better controlled, thereby enabling to form an electrode/wiring member with a desired width and thickness easily.

(Other Components in Electrically Conductive Paste Composition)

An electrically conductive paste composition of the invention, in addition to the aforementioned components, can further include other components commonly used in the art as needed. Other components include, for example, plasticizers, dispersants, surfactants, inorganic binders, metal oxides, ceramics, organic metal compounds, etc.

(Applying Method of Electrically Conductive Paste Composition and Forming Method of Electrode/Wiring Member)

First, an electrically conductive paste composition of the invention is applied on a substrate (e.g., silicon substrate) in a desired pattern, and then dried. Next, the applied paste on the substrate is fired in the air (in other words, in an oxygen existing atmosphere), thus obtaining an electrode/wiring member (e.g., solar cell electrodes) having a low electrical resistivity. As a method for applying the electrically conductive paste composition on a substrate, there, are, for example, screen printing method, inkjet printing method, dispenser printing method, etc. From a viewpoint of productivity, it is preferable to uses screen printing method.

In the case of applying an electrically conductive paste composition of the invention by screen printing, it is preferable to adjust a viscosity of the paste a range of 80 to 1000 Pa·s at 25° C. as the liquid properties. Meanwhile, the viscosity of an electrically conductive paste composition can be measured by means of e.g., a Brookfield HBT viscometer.

Heat treatment (firing) for forming an electrode/wiring member from an electrically conductive paste composition of the invention may be conducted under the commonly adopted conditions in the art Conventional heat treatment temperature is 800 to 900° C. However, in the case of an electrically conductive paste composition of the invention, it is possible to apply a lower heat treatment temperature than the conventional one. For example, it is possible to form an electrode/wiring member having good characteristics under the heat treatment conditions of 600 to 850° C. The heat treatment time can be appropriately selected depending on the annealing temperature, From a viewpoint of productivity, for example, a suitable range of the heat treatment time is 1 to 20 seconds.

The present invention will be described below with reference to specific examples. However, the invention is not limited to these examples, but various combinations of their features can be made.

[First Demonstration]
[Examination for Glass Composition]
(Preparation of Glass Composition)

Various glass composition samples (Glass Composition Samples 1-1 to 1-37) having the compositions shown in Table 1 were prepared. The compositions shown in Table 1 are expressed in terms of mass percent on the oxide basis. All the glass composition samples do not contain the JIG level A or B substances, but contain vanadium (V), phosphorus (P) and tungsten (W) as major constituents, and iron (Fe), manganese (Mn), zinc (Zn), and barium (Ba) as sub-constituents. The starting materials used were vanadium pentoxide ($V_2O_5$), phosphorus pentoxide ($P_2O_5$), tungsten trioxide ($WO_3$), ferric oxide ($Fe_2O_3$), manganese dioxide ($MnO_2$), zinc oxide (ZnO), and barium carbonate ($BaCO_3$). Barium phosphate ($Ba_3(PO_4)_2$) and iron phosphate ($FePO_4$) may be used as the starting materials. In this case, the content of $P_2O_5$ needs to be properly changed.

The glass composition samples were prepared as follows: First, various mixture powders were prepared by mixing the starting materials in the percentages shown in Table 1. Next, 300 g of each mixture powder was placed in a platinum crucible, heated in an electric furnace to 1100° C. at a rate of 5 to 10° C./min, and maintained at this temperature for 2 hrs while being stirred in order to form a uniform glass. Then, the platinum crucible was taken out from the electric furnace and the glass in the platinum crucible was poured over a stainless steel plate which was preheated to 200 to 300° C. Finally, the glass was milled using a stamping mill to obtain a powder of the glass composition.

(Evaluation and Measurement of Glass Composition)

The softening point and crystallization temperature of the glass composition samples were measured as follows: A differential thermal analyzer (DTA) (TG8120 available from Rigaku Co., Ltd.) was used. The reference material used was α-alumina. The weight of the reference material and each sample was 100 mg. The measurement was conducted in an air atmosphere and at a heating rate of 5° C./min. FIG. 1 shows an exemplary DTA curve obtained in the above-described DTA measurement. As shown in FIG. 1, the softening point of the glass composition sample was defined as the second endothermic peak temperature, and the crystallization temperature was defined as the starting temperature (determined by a tangent method) of the exothermic peak due to the crystallization. The results of the measurement are summarized in Table 1.

The adhesiveness of the glass composition samples to a substrate was measured as follows: Each glass composition powder (0.5 g) was placed on a silicon single crystalline substrate, heated to 800° C. in an air atmosphere, maintained for 30 sec, and cooled to room temperature. By this heat treatment, the glass composition powder once melted and then resolidified, and as a result a glass film was formed on the silicon single crystalline substrate. The resulting glass film was observed with naked eyes and was also evaluated for the adhesiveness to the silicon single crystalline substrate by a peel test.

The peel test was conducted by applying a strip of adhesive tape to the glass film and then pulling off the adhesive tape. When a glass film exhibited high glossiness and was not peeled off in the peel test, the adhesiveness of the glass film was marked with a "G" symbol of "good" in Table 1. When a glass film exhibited low glossiness (probably due to some degree of crystallization) but was not peeled off in the peel test, the adhesiveness of the glass film was marked with a "P" symbol of "poor". When a glass film crystallized, or was peeled off in the peel test, the adhesiveness of the glass film was marked with an "NG" symbol of "no good". The results of the evaluation of adhesiveness are also summarized in Table 1.

The moisture resistance of the glass composition samples was evaluated as follows: A glass film made of each glass composition sample was formed on a silicon single crystalline substrate in the same manner as used in the adhesiveness evaluation. Then, the glass film was kept at 85° C. and 85% relative humidity for 3 days, and then the change in appearance was observed with naked eyes. When a glass film underwent little or no appearance change, the glass composition of the glass film was marked with a "G" symbol of "good". When a glass film lost its transparency slightly and exhibited a degradation in glossiness, the glass composition of the glass film was marked with a "P" symbol of "poor". When a glass film underwent an apparent appearance change (e.g., discoloration or elution), the glass composition of the glass film was marked with an "NG" symbol of "no good". The results of the evaluation of moisture resistance are also summarized in Table 1.

The overall rating of the glass composition samples was determined based on all of the above measurements and evaluations. When a glass composition sample has a softening point of 550° C. or less, and its adhesiveness and moisture resistance are both marked with a "G" symbol, then the overall rating of the sample is marked with an "E" symbol of "excellent" in Table 1. When a glass composition sample has a softening point of 550° C. or less, and either its adhesiveness or its moisture resistance (but not both) is marked with a "P" symbol, then the overall rating of the sample is marked with a "G" symbol of "good". When a glass composition sample has a softening point of 550° C. or less, but its adhesiveness and moisture resistance are both marked with a "P" symbol, then the overall rating of the sample is marked with an "P" symbol of "poor". When a glass composition sample has a softening point of more than 550° C., and/or its adhesiveness and/or its moisture resistance is marked with an "NG" symbol, then the overall rating of the sample is marked with an "NG" symbol of "no good". The results of the overall rating are also summarized in Table 1.

TABLE 1

| *1 | Nominal Composition (mass %) | | | | | | | 3 ×[V$_2$O$_5$] [P$_2$O$_5$] | [FeO$_3$] + [MnO$_2$] | *3 | *4 | *5 | Overall Rating | |
| --- | --- | --- | --- | --- | --- | --- | --- | --- | --- | --- | --- | --- | --- | --- |
| | V$_2$O$_5$ | P$_2$O$_5$ | WO$_3$ | Fe$_2$O$_3$ | MnO$_2$ | ZnO | BaO | | | | | | | |
| 1-1 | 60 | 10 | | 5 | | | 25 | 18.0 | 5.0 | 404 | NG | P | NG | *6 |
| 1-2 | 50 | 12 | 10 | 10 | 5 | | 15 | 12.5 | 15.0 | 415 | P | G | G | *7 |
| 1-3 | 50 | 20 | | 10 | | | 20 | 7.5 | 10.0 | 448 | P | G | G | *7 |
| 1-4 | 50 | 25 | | | | | 25 | 6.0 | 0.0 | 440 | P | NG | NG | *6 |
| 1-5 | 45 | 25 | 10 | 10 | | | 10 | 5.4 | 10.0 | 443 | G | P | G | *7 |
| 1-6 | 45 | 25 | 15 | 5 | | 5 | 5 | 5.4 | 5.0 | 440 | G | NG | NG | *6 |
| 1-7 | 45 | 22 | | | | 10 | 23 | 6.1 | 0.0 | 420 | G | NG | NG | *6 |
| 1-8 | 40 | 30 | | 10 | | | 10 | 4.0 | 10.0 | 487 | G | P | G | *7 |
| 1-9 | 40 | 30 | 20 | 10 | | | | 4.0 | 10.0 | 480 | P | G | G | *7 |
| 1-10 | 40 | 30 | 5 | 10 | | | 15 | 4.0 | 10.0 | 476 | G | P | G | *7 |
| 1-11 | 40 | 25 | 5 | 10 | 10 | | 10 | 4.8 | 10.0 | 451 | G | G | E | *7 |
| 1-12 | 40 | 25 | 15 | 5 | | 5 | 10 | 4.8 | 5.0 | 465 | G | G | E | *7 |
| 1-13 | 40 | 25 | 10 | 5 | | 5 | 15 | 4.8 | 5.0 | 462 | G | G | E | *7 |
| 1-14 | 40 | 25 | 15 | 10 | 3 | | 7 | 4.8 | 10.0 | 454 | G | P | G | *7 |
| 1-15 | 40 | 25 | | 15 | 10 | | 10 | 4.8 | 25.0 | 470 | NG | P | NG | *6 |
| 1-16 | 40 | 20 | 15 | 15 | | | 10 | 6.0 | 15.0 | 446 | P | G | G | *7 |
| 1-17 | 40 | 25 | 10 | 5 | | 10 | 10 | 4.8 | 5.0 | 455 | G | P | G | *7 |
| 1-18 | 40 | 30 | 15 | 5 | | | 10 | 4.0 | 5.0 | 520 | G | G | E | *7 |
| 1-19 | 35 | 30 | | 5 | | | 30 | 3.5 | 5.0 | 516 | P | G | G | *7 |
| 1-20 | 35 | 30 | 20 | 15 | | | | 3.5 | 15.0 | 511 | P | G | G | *7 |
| 1-21 | 30 | 30 | 10 | 10 | 10 | | 10 | 3.0 | 10.0 | 503 | G | G | E | *7 |
| 1-22 | 30 | 30 | 20 | 10 | | | 10 | 3.0 | 10.0 | 525 | G | G | E | *7 |
| 1-23 | 30 | 30 | 25 | 5 | | | 10 | 3.0 | 5.0 | 550 | G | G | E | *7 |
| 1-24 | 30 | 30 | 10 | 5 | 10 | | 15 | 3.0 | 5.0 | 508 | P | G | G | *7 |

TABLE 1-continued

| *1 | Nominal Composition (mass %) | | | | | | | 3×[V$_2$O$_5$] / [P$_2$O$_5$] | [FeO$_3$] + [MnO$_2$] | *3 | *2 *4 | *5 | Overall Rating | |
|---|---|---|---|---|---|---|---|---|---|---|---|---|---|---|
| | V$_2$O$_5$ | P$_2$O$_5$ | WO$_3$ | Fe$_2$O$_3$ | MnO$_2$ | ZnO | BaO | | | | | | | |
| 1-25 | 30 | 30 | 25 | 15 | | | | 3.0 | 15.0 | 527 | P | G | G | *7 |
| 1-26 | 30 | 25 | 10 | 20 | | 10 | 5 | 3.6 | 20.0 | 493 | NG | G | NG | *6 |
| 1-27 | 30 | 25 | 10 | 5 | 10 | 10 | 10 | 3.6 | 15.0 | 480 | P | G | G | *7 |
| 1-28 | 30 | 25 | 20 | 15 | | | 10 | 3.6 | 15.0 | 530 | G | G | E | *7 |
| 1-29 | 30 | 25 | 25 | | | 10 | 10 | 3.6 | 0.0 | 540 | P | P | P | *6 |
| 1-30 | 30 | 20 | 30 | 20 | | | | 4.5 | 20.0 | 530 | NG | G | NG | *6 |
| 1-31 | 25 | 25 | 40 | | 10 | | | 3.0 | 10.0 | 550 | G | G | E | *7 |
| 1-32 | 25 | 25 | 40 | 10 | | | | 3.0 | 10.0 | 545 | G | G | E | *7 |
| 1-33 | 25 | 25 | 5 | 10 | | 10 | 25 | 3.0 | 10.0 | 503 | P | P | P | *6 |
| 1-34 | 25 | 30 | 10 | 10 | 10 | 10 | 5 | 2.5 | 20.0 | 530 | NG | G | NG | *6 |
| 1-35 | 25 | 20 | 20 | 20 | | | 15 | 3.8 | 20.0 | 530 | NG | G | NG | *6 |
| 1-36 | 25 | 25 | 30 | 5 | | | 15 | 3.0 | 5.0 | 537 | P | G | G | *7 |
| 1-37 | 20 | 30 | 20 | | 20 | 10 | | 2.0 | 20.0 | 495 | P | NG | NG | *6 |

*1: Glass Composition Sample No.,
*2: Glass Characteristics,
*3: Softening Point (° C.),
*4: Adhesiveness at 800° C.,
*5: Moisture Resistance,
*6: Comparative Example,
*7: Example As shown in Table 1, Glass Composition Samples No.: 1-2, 1-3, 1-5, 1-8 through 1-14, 1-16 through 1-25, 1-27, 1-28, 1-31, 1-32 and 1-36 are prepared according to the present invention (indicated by "Example" in the rightmost column of Table 1). In these samples (Examples), the numerical value of the total mass percentage of Fe$_2$O$_3$ and MnO$_2$ ([Fe$_2$O$_3$]+ [MnO$_2$]) is larger than three times the mass percentage ratio of V$_2$O$_5$ to P$_2$O$_5$ ([V$_2$O$_5$]/[P$_2$O$_5$]); the total content of Fe$_2$O$_3$ and MnO$_2$ is 5 to 15 mass %; the content of WO$_3$ is from 0 to 40 mass %; and the total content of ZnO and BaO is from 0 to 30 mass %. These samples (Examples) have a softening point of 550° C. or less, exhibit good adhesiveness and/or good moisture resistance (at least one of the evaluations is "G"), and have an overall rating of "E" or "G".

On the other hand, Glass Composition Samples No.: 1-1, 1-4, 1-6, 1-7, 1-15, 1-26, 1-29, 1-30, 1-33 through 1-35 and 1-37 are not prepared according to the invention (indicated by "Comparative Example"). In these samples (Comparative Examples), the adhesiveness, the moisture resistance and the overall rating are all marked with "P", or the adhesiveness or the moisture resistance is marked with "NG". Thus, these samples are not suitable as an electrode/wiring member.

[Second Demonstration]
[Examination for Electrode/Wiring Member]
(Preparation of Conductive Paste)

In order to prepare conductive pastes containing a metal powder and a glass composition powder, a silver powder with an average particle diameter of about 2 μm was used as the metal powder, and a powder of Glass Composition Sample No. 1-11, which exhibited excellent properties in the first demonstration, was used as the glass composition powder. Various conductive pastes (Sample No. 2-1 to 2-7) were each prepared as follows: The silver powder and the glass composition powder were mixed in the volume percentages shown in Table 2 to prepare a mixture powder. Then, a binder resin was mixed with the mixture powder in a solvent, which were then kneaded together. Ethyl cellulose was used as the binder resin, and diethylene glycol monobutyl ether acetate was used as the solvent.

(Formation of Electrode/Wiring Member)

The thus prepared conductive paste was screen printed on a heat-resistant glass substrate to form a silver thick film electrode/wiring line (width of 100 μm, length of 50 mm, and thickness of 5 μm). Then, the silver electrode/wiring line was heat treated by maintaining it at 550° C. in an air atmosphere for 30 min.

(Electrical Resistivity Measurement and Adhesiveness Evaluation of Electrode/Wiring Member)

The electrical resistivity of the thus formed electrode/wiring lines was measured by a conventional four-probe resistive method at room temperature. Also, the adhesiveness of the electrode/wiring lines was evaluated by a peel test. The peel test was conducted by applying a strip of adhesive tape to each electrode/wiring line and then pulling off the adhesive tape. When the silver particles of an electrode/wiring line were almost completely peeled off, the adhesiveness of the electrode/wiring line was marked with an "NG" symbol of "no good" in Table 2. When the silver particles of an electrode/wiring line were partially peeled off, and some part of the electrode/wiring line was broken, the adhesiveness of the electrode/wiring line was marked with a "P" symbol of "poor". When a small amount of the silver particles of an electrode/wiring line stuck to the adhesive tape, but the electrode/wiring line was not broken, the adhesiveness of the electrode/wiring line was marked with a "G" symbol of "good". When the silver particles of an electrode/wiring line were not peeled off at all, the adhesiveness of the electrode/wiring line was marked with an "E" symbol of "excellent". The results of the electrical resistivity measurement and the peel test are summarized in Table 2.

TABLE 2

| Conductive Paste Sample No. | *1 | Composition (vol. %) | | Electrical Resistivity (Ωcm) | Adhesiveness |
|---|---|---|---|---|---|
| | | Ag | Glass | | |
| 2-1 | 1-11 | 100 | 0 | 5 × 10$^{-6}$ | NG |
| 2-2 | | 95 | 5 | 9 × 10$^{-6}$ | P |
| 2-3 | | 90 | 10 | 1 × 10$^{-5}$ | G |
| 3-4 | | 85 | 15 | 3 × 10$^{-4}$ | E |
| 2-5 | | 80 | 20 | 6 × 10$^{-4}$ | E |
| 2-6 | | 70 | 30 | 1 × 10$^{-3}$ | E |
| 2-7 | | 50 | 50 | 7 × 10$^{-4}$ | E |

*1: Glass Composition Sample No.

As shown in Table 2, when the content of the glass composition powder is less than 30 vol. % (or the content of the silver powder is more than 70 vol. %), the electrical resistivity of the electrode/wiring member is as low as lower than $10^{-3}$ $\Omega \cdot cm$. Also, when the content of the glass composition powder is more than 10 vol. % (or the content of the silver powder is less than 90 vol. %), good (strong) adhesiveness is obtained. Thus, by mixing 10 to 30 vol. % of the glass composition powder and 70 to 90 vol. % of the silver powder, an electrode/wiring member having both low electrical resistivity and strong adhesiveness can be obtained.

Similarly to the above, various conductive pastes were prepared and evaluated by using, as the metal powder, a copper powder with an average particle diameter of about 2 $\mu m$. A powder of Glass Composition Sample No. 1-11 was used as the glass composition powder; nitrocellulose was used as the binder resin; and diethylene glycol monobutyl ether acetate was used as the solvent. The thus prepared conductive paste containing the copper powder was screen printed on a heat-resistant glass substrate to form a copper thick film electrode/wiring line (width of 100 $\mu m$, length of 50 mm, and thickness of 5 $\mu m$). Then, the copper electrode/wiring line was heat treated by maintaining it at 600° C. in a nitrogen atmosphere for 30 min.

The electrical resistivity measurement and adhesiveness evaluation of the copper thick film electrode/wiring lines were conducted similarly to the above. The results showed that the content of the glass composition powder was preferably 10 to 30 vol. % and the content of the copper powder was 70 to 90 vol. %, similarly to the results obtained for the silver electrode/wiring lines. Thus, it is demonstrated that even when a metal powder other than a silver powder is used, the electrode/wiring member according to the present invention provides both low electrical resistivity and strong adhesiveness.

[Third Demonstration]
(Application to Solar Cell Panel)

A third demonstration is an exemplary application of the invented electrode/wiring member to a solar cell panel.

Figure 2A:
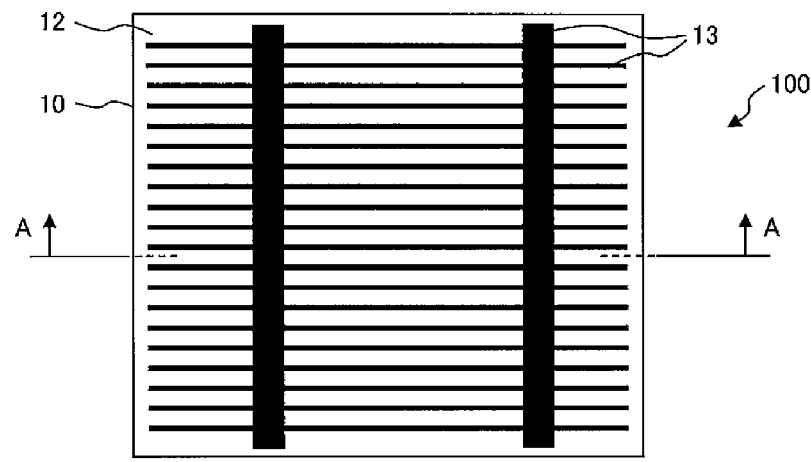
FIG. 2(a) is a plane view of the light receiving plane.
Figure 2B:
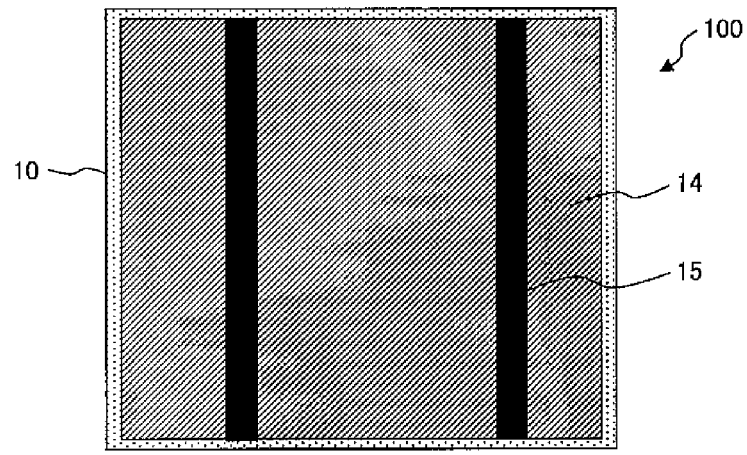
FIG. 2(b) is a plane view of the back side plane.
Figure 2C:
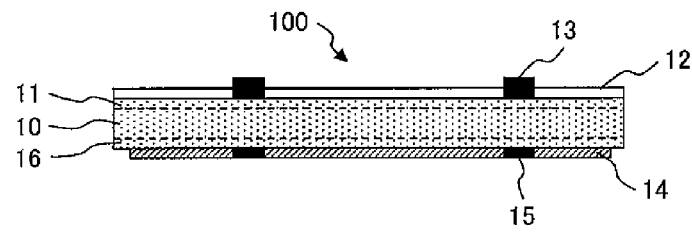
FIG. 2(c) is a cross-sectional view taken along the A-A line in FIG. 2(a).

FIG. 2 is a schematic illustration showing an exemplary solar cell panel, in which FIG. 2(a) is a plane view of the light receiving plane, FIG. 2(b) is a plane view of the back side plane, and FIG. 2(c) is a cross-sectional view taken along the A-A line in FIG. 2(a). The description below will be made with reference to FIG. 2.

As shown in FIG. 2, in a solar cell panel 100 a single crystalline or polycrystalline silicon substrate, or the like is usually used as a semiconductor substrate 10. The semiconductor substrate 10 is a p-type semiconductor substrate containing a p-type dopant such as boron. The light receiving plane is roughened by etching or the like in order to reduce reflection of sunlight. Also, a surface layer of the light receiving plane is doped with an n-type dopant such as phosphorus in order to form an n-type diffusion layer 11 having a submicron thickness and also to form a p-n junction between the p-type bulk substrate 10 and the n-type diffusion layer 11. In addition, an about 100-nm thick antireflection layer 12 made of silicon nitride or the like is formed on the light receiving plane by vapor deposition or the like.

Next, there will be described the formation of a light receiving plane electrode/wiring member 13 formed on the light receiving plane, and a current collecting electrode/wiring member 14 and an output electrode/wiring member 15 formed on the back side plane of the semiconductor substrate 10. Typically, a conductive paste made of a glass powder and a silver powder is used to form the light receiving plane electrode/wiring member 13 and the output electrode/wiring member 15. On the other hand, a conductive paste made of a glass powder and an aluminum powder is used to form the current collecting electrode/wiring member 14. Each conductive paste is applied to the corresponding plane of the semiconductor substrate 10 by screen printing or the like.

After applying the conductive paste, each conductive paste is dried, and then fired at 500 to 800° C. in an air atmosphere, thereby forming the corresponding electrode/wiring member. During this heat treatment, on the side of the light receiving plane, the glass composition contained in the light receiving plane electrode/wiring member 13 chemically reacts with the antireflection layer 12, thereby establishing electrical connection between the electrode/wiring member 13 and the diffusion layer 11. On the side of the back side plane, aluminum contained in the current collecting electrode/wiring member 14 diffuses into the semiconductor substrate 10, thereby forming an electrode constituent diffusion layer 16 in the outermost surface of the back side plane. The formation of the electrode constituent diffusion layer 16 provides strong bonding between the current collecting electrode/wiring member 14 and the semiconductor substrate 10, and also establishes ohmic contact between the semiconductor substrate 10 and the current collecting electrode/wiring member 14 and between the semiconductor substrate 10 and the output electrode/wiring member 15.

(Fabrication of Solar Cell Panel)

A solar cell panel according to the present invention was fabricated. First, a conductive paste for the current collecting electrode/wiring member 14 was prepared using an aluminum powder with an average particle diameter of about 5 $\mu m$ and a powder of Glass Composition Sample No. 1-11. The content of the aluminum powder was 99 vol. %, and the content of the glass composition powder was 1 vol. %. An acrylic resin was used as the binder resin, and $\alpha$-terpineol was used as the solvent. The conductive paste of Sample No. 2-3 in Table 2 was used for the light receiving plane electrode/wiring member 13 and the output electrode/wiring member 15. Also, there was prepared a semiconductor substrate 10 having an n-type diffusion layer 11 and an antireflection layer 12 formed in the light receiving plane. The above conductive paste for the current collecting electrode/wiring member 14 contains only 1 vol. % of the glass composition powder. However, as already described, the current collecting electrode/wiring member 14 can be adhered to the semiconductor substrate 10 via the electrode constituent diffusion layer 16. Therefore, even when a conductive paste containing a low volume percentage of a glass composition is used for the current collecting electrode/wiring member 14, it has sufficient adhesiveness to the substrate 10.

Next, in order to form the current collecting electrode/wiring member 14 shown in FIGS. 2(b) and 2(c), the above-described conductive paste was screen-printed to the back side plane of the semiconductor substrate 10. And then, the thus printed semiconductor substrate 10 was dried, heated to 850° C. in a continuous heating infrared furnace in an air atmosphere, and maintained at 850° C. for 5 sec. In this manner, the current collecting electrode/wiring member 14 was formed on the back side plane of the semiconductor substrate 10.

Finally, in order to form the light receiving plane electrode/wiring member 13 and the output electrode/wiring member 15 shown in FIGS. 2(a) to 2(c), the conductive paste of Sample No. 2-3 was screen-printed to the light receiving plane and the back side plane of the semiconductor substrate 10, respectively. And then, the thus printed semiconductor substrate 10 was dried, heated to 750° C. in a rapid heating infrared furnace in an air atmosphere, and maintained at 750°

C. for 1 min. In this manner, the light receiving plane electrode/wiring member 13 and the output electrode/wiring member 15 were formed.

(Test and Evaluation of Solar Cell Panel)

Various tests and evaluations were conducted for the above fabricated solar cell panel. The results showed that the light receiving plane electrode/wiring member 13 was electrically connected to the semiconductor substrate 10. Also, the electrode constituent diffusion layer 16 was normally formed in the back side plane, and ohmic contact was established between the semiconductor substrate 10 and the current collecting electrode/wiring member 14 and between the semiconductor substrate 10 and the output electrode/wiring member 15.

In addition, the above fabricated solar cell panel was kept at 85° C. and 85% relative humidity for 100 hrs as a high temperature and high humidity test. The result showed that there was no increase in the resistance of each of the electrode/wiring members or in the contact resistance between each of the electrode/wiring members and the semiconductor substrate 10. The power generation efficiency of the solar cell panel was also tested and evaluated. The result showed that the power generation efficiency obtained for the invented solar cell panel was substantially the same as those of conventional solar cell panels employing, as the electrode/wiring member, a mixture of a Pb-based glass phase and a silver powder.

Thus, it is demonstrated that the electrode/wiring member according to the present invention can be used to form electrode/wiring members for solar cell panels. In addition, the present invention can be also applied to back contact solar cell panels. Furthermore, the invented electrode/wiring member can be effectively used to form electrode/wiring members for other electronic devices than solar cell panels.

[Fourth Demonstration]

(Application to Plasma Display Panel)

Figure 3:
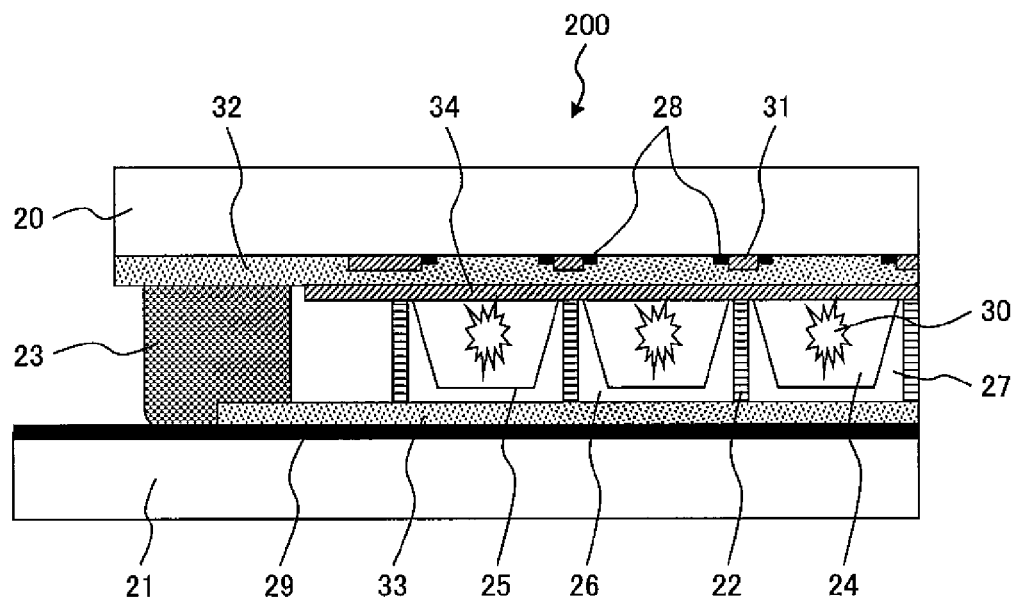
FIG. 3 is a schematic illustration showing a cross-sectional view of an exemplary plasma display panel.

A fourth demonstration is an exemplary application of the invented interconnection material to a plasma display panel (PDP). FIG. 3 is a schematic illustration showing a cross-sectional view of an exemplary plasma display panel. The description below will be made with reference to FIG. 3.

First, a typical plasma display panel is described. As shown in FIG. 3, a plasma display panel 200 has a front plate 20 and a back plate 21 facing each other with a gap of 100 to 150 μm therebetween. The front and back plates 20 and 21 are supported by barrier ribs 22 disposed therebetween to maintain the gap therebetween. And, the gap between the two plates is evacuated and filled with a noble gas, and then the periphery of the front and back plates 20 and 21 is gas-tight sealed with a sealant 23.

The front plate 20 includes: display electrode lines 28 on the surface of the front plate 20; a dielectric layer 32 to cover the display electrodes 28; and, on the dielectric layer 32, a protective layer 34 (e.g., a vapor-deposited magnesium oxide (MgO) film) for protecting the display electrodes 28 and others from discharge. The back plate 21 includes: address electrode lines 29 on the surface of the back plate 21; a dielectric layer 33 to cover the address electrode lines 29; and, on the dielectric layer 33, barrier ribs 22 for defining cells 24. The barrier ribs 22 are formed of a material which contains at least a glass composition and a filler and is sintered at 500 to 600° C. The barrier ribs 22 typically have a stripe or box structure. The address electrode lines 29 on the back plate 21 are arranged to be perpendicular to the display electrode lines 28 on the front plate 20.

A phosphor is disposed in each of the cells 24 defined by the barrier ribs 22. The phosphor in each cell 24 is formed by applying a paste containing the phosphor to the inner wall of the cell 24 and firing the applied paste at 450 to 500° C. Each pixel includes three color cells: a cell having a red phosphor 25; a cell having a green phosphor 26; and a cell having a blue phosphor 27. Each pixel generates light of various colors, which are determined by the signals transmitted through the corresponding display electrode lines 28 and address electrode lines 29.

The sealant 23 is preapplied to the peripheral of the front plate 20 or the back plate 21 using a dispenser, printing, or another technique. In some cases, the thus preapplied sealant 23 may be prefired simultaneously with the firing of the phosphors 25 to 27. By such prefiring, the amount of gas voids trapped in the resulting seal can be significantly reduced, and therefore the reliability (the gas-tightness) of the resulting seal can be enhanced.

Next, the separately formed front and back plates 20 and 21 are precisely aligned and positioned to face each other and are then bonded by heating the sealant to 420 to 500° C. Simultaneously with this heating, the interiors of the cells 24 are evacuated and then filled with a noble gas, thus completing the fabrication of the plasma display panel 200. During this prefiring or sealing process, the sealant 23 may directly touch the display electrode lines 28 or the address electrode lines 29. It is therefore required that the sealant 23 should not chemically react with materials for these electrode/wiring lines.

In order to generate light at a particular cell 24 of the plasma display panel 200, a voltage is applied across the corresponding display electrode line 28 and address electrode line 29, thereby generating an address discharge in the cell 24, then exiting the noble gas into a plasma state, and then accumulating wall charges in the cell 24. Then, by applying a required voltage across the corresponding pair of display electrode lines, a display discharge occurs only in the cell 24 having accumulated wall charges and as a result an ultraviolet light 30 is generated. And then, this ultraviolet light 30 excites the corresponding phosphor (the phosphor 25, 26 or 27), which in turn emits the corresponding visible light. All the cells 24 of the plasma display panel 200 are similarly activated, thereby displaying an image.

Conventionally, silver thick film electrode/wiring members are used as the display electrode lines 28 and the address electrode lines 29 because of the good electrical properties and the high oxidation resistance during manufacture. The display electrode lines 28 and the address electrode lines 29 can be formed by sputtering, but printing techniques are advantageous because of low cost. The dielectric layers 32 and 33 are typically formed by a printing technique. After the display and address electrode lines 28 and 29, and the dielectric layers 32 and 33 are formed by printing, they are typically fired in an oxidizing atmosphere at a temperature of 450 to 620° C.

Silver thick film electrode/wiring members have problems in that the silver contained in them undergoes significant electromigration and their material cost is high. One possible solution to these problems is to use a copper thick film electrode/wiring member instead. However, in order to make a practical use of such a copper thick film electrode/wiring member, the following conditions, for example, need to be satisfied: (1) The copper contained in the electrode/wiring member should not be oxidized during firing process because otherwise the electrical resistivity of the electrode/wiring member may increase. (2) There should be no chemical reaction between the electrode/wiring member and the dielectric layer. (3) No voids (such as gas voids) should be generated in the area surrounding the electrode/wiring member because otherwise the breakdown voltage of the dielectric layers 32 and 33 may decrease.

(Fabrication of Plasma Display Panel)

A plasma display panel according to the present invention was fabricated. First, the conductive copper paste described above in the second demonstration was screen printed to the entire surfaces of the front and back plates 20 and 21, and was then dried in an air atmosphere at 150° C. The thus printed films on the front and back plates 20 and 21 were patterned by photolithography to form the display and address electrode lines 28 and 29 respectively, and were then fired in an air atmosphere at 600° C. for 30 min.

Next, a black matrix 31 and the dielectric layer 32 were formed over the display electrode lines 28, and the dielectric layer 33 was formed over the address electrode lines 29. Then these layers were fired in an air atmosphere at 610° C. for 30 min. The thus fabricated front and back plates 20 and 21 were positioned to face each other, and then the outer periphery of the two plates was sealed with a glass seal, thus completing the fabrication of the plasma display panel 200 having the FIG. 3 structure.

(Evaluation of Plasma Display Panel)

Evaluation of the thus fabricated plasma display panel showed that after the display and address electrode lines 28 and 29, which were formed using the copper-containing conductive paste of the present invention, were fired, they underwent no discoloration due to oxidation. Also, no voids were observed in the boundary region between the display electrode lines 28 and the dielectric layer 32 or in the boundary region between the address electrode lines 29 and the dielectric layer 33. Thus, a plasma display panel having a defect-free appearance could be fabricated.

As a further test, the thus fabricated plasma display panel was lit. The result showed that there was no increase in the electrical resistivities of the display and address electrode lines 28 and 29. Also, the breakdown voltage of the panel did not decrease. Unlike silver thick film electrode/wiring members, any electromigration was not observed. In addition, any other undesirable defects were not observed. The above results demonstrate that the copper-containing conductive paste according the present invention can be used for electrode/wiring members for plasma display panels. In addition, the copper-containing conductive paste of the invention can replace expensive conventional silver thick film electrode/wiring members, thus leading to substantial cost reduction.

[Fifth Demonstration]

(Application to Multilayer Wiring Board)

Figure 4:
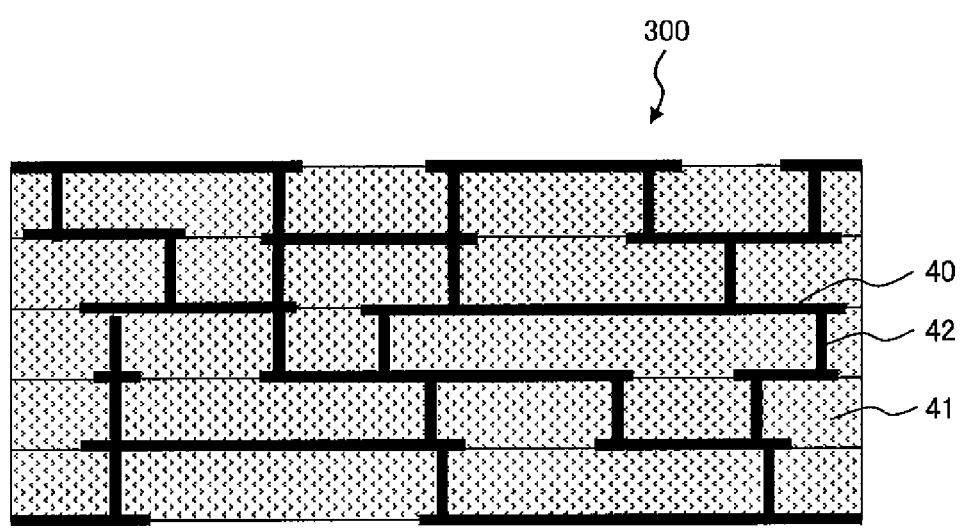
FIG. 4 is a schematic illustration showing a cross-sectional view of a multilayer (5-layer) wiring board made of LTCC (Low Temperature Co-fired Ceramics) before firing.

A fifth demonstration is an exemplary application of the invented interconnection material to a multilayer wiring board. FIG. 4 is a schematic illustration showing a cross-sectional view of a multilayer (5-layer) wiring board made of LTCC (Low Temperature Co-fired Ceramics) before firing. As illustrated in FIG. 4, in a multilayer wiring board 300, interconnections lines made from a conductive paste 40 are wired three-dimensionally. The description below will be made with reference to FIG. 4.

The multilayer wiring board 300 is typically formed in the following manner: First, there is formed a green sheet 41 made of a material containing a glass powder, a ceramic powder and a binder, and then through-holes 42 are formed at desired locations of the green sheet 41. The conductive paste 40 is printed onto the front surface of the green sheet 41 so as to form a desired interconnection pattern, and simultaneously the through-holes 42 are filled with the paste 40. As needed, the paste 40 is also printed onto the back surface of the green sheet 41 after the paste 40 printed on the front surface is dried.

Then, multiple such green sheets 41, each having its own interconnection pattern, are stacked and then fired together, thereby forming the multilayer wiring board 300 made from LTCC. This firing is typically performed in an air atmosphere around 900° C. Conductive silver pastes are typically used as the conductive paste 40 because of their good electrical properties and high oxidation resistance during manufacture.

The use of conductive copper pastes in place of conductive silver pastes is being investigated because of their high electromigration resistance and low cost. However, conductive copper pastes need to be fired in a nitrogen atmosphere in order to prevent oxidation. Such a firing process in a nitrogen atmosphere cannot sufficiently remove the binder contained in the conductive paste 40 and/or the green sheets 41. Thus, it is conventionally difficult to form a multilayer wiring board made of dense materials.

Also, when a conventional conductive copper paste is used as the conductive paste 40, its glass phase in the boundary regions between the green sheet 41 and the interconnection is prone to soften and flow during the firing process, and as a result the copper particles are oxidized, thus leading to increase in the electrical resistivity of the interconnection. In addition, voids may be generated in the above boundary regions due to chemical reaction between the glass phase and the copper particles.

(Fabrication of Multilayer Wiring Board)

Figure 5:
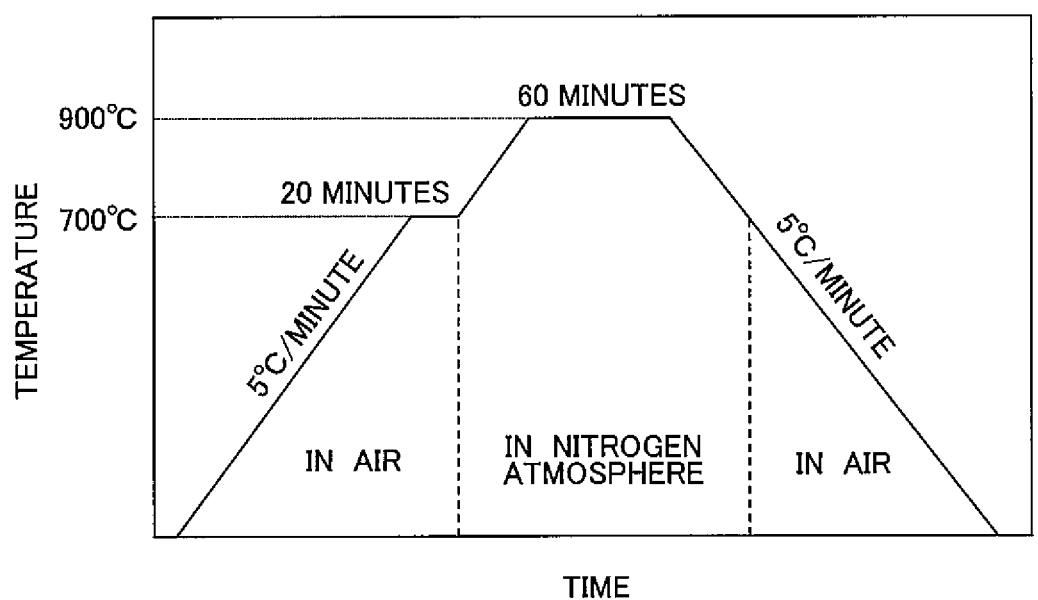
FIG. 5 is an exemplary time-temperature schedule used to fire a multilayer wiring board according to the present invention.

A multilayer wiring board according to the present invention was fabricated. The conductive copper paste described above in the second demonstration was used as the conductive paste 40 for interconnection use. Then, a multilayer wiring board (a stack of green sheets) as shown in FIG. 4 was formed in the similar manner to that described above. Finally, the stack was fired according to the FIG. 5 time-temperature schedule. FIG. 5 is an exemplary time-temperature schedule used to fire the multilayer wiring board according to the present invention. As shown in FIG. 5, the multilayer wiring board was heated, in an air atmosphere, from room temperature to 700° C. and maintained at this temperature for 20 min; and was further heated, in a nitrogen atmosphere, to 900° C., maintained at this temperature for 60 min and cooled to 700° C.; and was further cooled to room temperature in an air atmosphere. The time-temperature schedule used is not limited to the one shown in FIG. 5.

(Evaluation of Multilayer Wiring Board)

The electrical resistivity measurement of the interconnection of the thus fabricated multilayer wiring board showed that the resulting electrical resistivity was as designed. This indicated that the metal particles contained in the conductive paste for interconnection use were not oxidized. Next, the cross section of the multilayer wiring board was examined. The multilayer wiring board was sufficiently fired and the resulting board was made of sufficiently dense materials. Probably, the binder contained in the conductive paste and the green sheets was almost completely removed during the heating step to 700° C. Also, it was observed that no voids were generated in the boundary regions between the interconnection and the green sheets due to chemical reaction between the glass phase and the interconnection. The above results shows that the conductive paste according to the present invention can be used for interconnections for multilayer wiring boards.

The above results demonstrate the following: The electrode/wiring member made of the glass composition according to the present invention has low electrical resistivity and strong adhesiveness. Also, the invented glass composition and the electrode/wiring member containing the invented glass composition comply with the RoHS directive and also do not contain substances included in the JIG level A and B lists, and therefore green (environmentally friendly) designs can be achieved.

The invention claimed is:

1. A glass composition, comprising: phosphorus, vanadium, tungsten and at least one transition metal selected from a group consisting of iron, manganese, and zinc, the glass composition not containing substances included in the JIG level A and B lists and alkali metal, a softening point of the glass composition being 550° C. or lower.

2. An electrically conductive paste composition, comprising: the glass composition according to claim 1; a metal powder; and a vehicle.

3. The electrically conductive paste composition according to claim 2, wherein the metal powder is silver, copper, aluminum, or an alloy containing one of these metals as a major constituent.

4. An electrode/wiring member, including: the glass composition according to claim 1; and a metal powder.

5. The electrode/wiring member according to claim 4, wherein the metal powder is silver, copper, aluminum, or an alloy containing one of these metals as a major constituent.

6. An electronic component, comprising an electrode/wiring member, the electrode/wiring member including:
   a metal powder; and
   a glass phase made from the glass composition according to claim 1.

7. The electronic component according to claim 6, wherein the electronic component is a display device, a solar cell panel, or a ceramic mounting board.

8. A glass composition, comprising phosphorus and transition metals, the transition metals including: vanadium and tungsten; and iron and/or manganese, the glass composition not containing substances included in the JIG level A and B lists and alkali metals, wherein:
   the phosphorus (P), the vanadium (V), the iron (Fe) and the manganese (Mn) are on the oxide basis in the form of $P_2O_5$, $V_2O_5$, $Fe_2O_3$ and $MnO_2$, respectively;
   numerical values of mass percentages of the $P_2O_5$, the $V_2O_5$, the $Fe_2O_3$ and the $MnO_2$ satisfy the equation (1) below; and
   a total mass percentage of the $Fe_2O_3$ and the $MnO_2$ is within a range from 5 to 15 mass %

$$3\times[V_2O_5]/[P_2O_5]<[Fe_2O_3]+[MnO_2] \quad \text{Equation (1)}$$

9. An electrically conductive paste composition, comprising: the glass composition according to claim 8; a metal powder; and a vehicle.

10. The electrically conductive paste composition according to claim 9, wherein the metal powder is silver, copper, aluminum, or an alloy containing one of these metals as a major constituent.

11. An electrode/wiring member, including: the glass composition according to claim 8; and a metal powder.

12. The electrode/wiring member according to claim 11, wherein the metal powder is silver, copper, aluminum, or an alloy containing one of these metals as a major constituent.

13. An electronic component, comprising an electrode/wiring member, the electrode/wiring member including:
   a metal powder; and
   a glass phase made from the glass composition according to claim 8.

14. The electronic component according to claim 13, wherein the electronic component is a display device, a solar cell panel, or a ceramic mounting board.

15. A glass composition, comprising, on average and on the oxide basis: 25 to 60 mass % of $V_2O_5$ (vanadium pentoxide); 12 to 30 mass % of $P_2O_5$ (phosphorus pentoxide); 0 to 15 mass % of $Fe_2O_3$ (ferric oxide); 0 to 15 mass % of $MnO_2$ (manganese dioxide); 5 to 40 mass % of $WO_3$ (tungsten trioxide); 0 to 30 mass % of BaO (barium oxide); and 0 to 20 mass % of ZnO (zinc oxide), the glass composition not containing substances included in the JIG level A and B lists and alkali metals, wherein:
   a total content of the $Fe_2O_3$ and the $MnO_2$ is within a range from 5 to 15 mass %; and
   a total content of the BaO and the ZnO is within a range from 0 to 30 mass %.

16. An electrically conductive paste composition, comprising: the glass composition according to claim 15; a metal powder; and a vehicle.

17. The electrically conductive paste composition according to claim 16, wherein the metal powder is silver, copper, aluminum, or an alloy containing one of these metals as a major constituent.

18. An electrode/wiring member, including: the glass composition according to claim 15; and a metal powder.

19. The electrode/wiring member according to claim 18, wherein the metal powder is silver, copper, aluminum, or an alloy containing one of these metals as a major constituent.

20. An electronic component, comprising an electrode/wiring member, the electrode/wiring member including:
   a metal powder; and
   a glass phase made from the glass composition according to claim 15.

21. The electronic component according to claim 20, wherein the electronic component is a display device, a solar cell panel, or a ceramic mounting board.

* * * * *